(12) United States Patent
Kwong et al.

(10) Patent No.: US 6,388,890 B1
(45) Date of Patent: May 14, 2002

(54) TECHNIQUE FOR REDUCING THE NUMBER OF LAYERS IN A MULTILAYER CIRCUIT BOARD

(75) Inventors: Herman Kwong, Kanata (CA); Larry E. Marcanti, Allen, TX (US)

(73) Assignee: Nortel Networks Limited, Montreal ( * ) Notice: Subject to any disclaimer, the term of this patent is extended or adjusted under 35 U.S.C. 154(b) by 0 days.

(21) Appl. No.: 09/651,188

(22) Filed: Aug. 30, 2000

Related U.S. Application Data

(60) Provisional application No. 60/212,387, filed on Jun. 19, 2000.

(51) Int. Cl.[7] .................................................. H05K 7/06

(52) U.S. Cl. ........................ 361/780; 361/794; 174/255; 174/261; 174/262

(58) Field of Search ................................ 361/767, 768, 361/780, 783, 792, 794, 795; 174/260–262, 255; 257/700–703, 723, 724, 778; 333/247; 29/846, 582; 438/125

(56) References Cited

U.S. PATENT DOCUMENTS

| | | | | |
|---|---|---|---|---|
| 5,281,151 A | * | 1/1994 | Arima et al. | 361/792 |
| 5,451,721 A | * | 9/1995 | Tsukada et al. | 174/262 |
| 5,686,764 A | * | 11/1997 | Fulcher | 257/700 |

* cited by examiner

Primary Examiner—Kamavel B Cuneo
Assistant Examiner—John B. Vigushin
(74) Attorney, Agent, or Firm—Hunton & Williams

(57) ABSTRACT

A technique for reducing the number of layers in a multilayer circuit board is disclosed. In one embodiment, the technique is realized by forming a first plurality of electrically conductive vias in the multilayer circuit board extending from the surface of the multilayer circuit board to a first of the plurality of electrically conductive signal layers, wherein the first plurality of electrically conductive vias are arranged so as to form a channel in a second of the plurality of electrically conductive signal layers beneath the first plurality of electrically conductive vias. A first plurality of electrical signals are routed on the first of the plurality of electrically conductive signal layers. A second plurality of electrical signals are routed on the second of the plurality of electrically conductive signal layers in the channel formed in the second of the plurality of electrically conductive signal layers.

28 Claims, 15 Drawing Sheets

TECHNIQUE FOR REDUCING THE NUMBER OF LAYERS IN A MULTILAYER CIRCUIT BOARD

CROSS-REFERENCE TO RELATED APPLICATIONS

This patent application is a U.S. Patent Application claiming priority to U.S. Provisional Patent Application No. 60/212,387, filed Jun. 19, 2000, which is hereby incorporated by reference herein in its entirety.

FIELD OF THE INVENTION

The present invention relates generally to multilayer circuit boards and, more particularly, to a technique for reducing the number of layers in a multilayer circuit board.

BACKGROUND OF THE INVENTION

The making of electrical connections between electronic components has long been accomplished using printed circuit boards. The first such circuit boards had only a single signal layer on a top surface thereof for routing electrical signals between electronic components mounted thereon. These single signal layer circuit boards have severe limitations with regard to the number of electrical signals that can be routed between electronic components mounted on the same circuit board. That is, the number of electrical signals that can be routed between electronic components mounted on a single signal layer circuit board is limited by the amount of area on the single signal layer.

The area limitations associated with single signal layer circuit boards led to the development of multilayer printed circuit boards. Such multilayer printed circuit boards may be either single or double-sided and may have multiple signal layers on the surface of and buried within the multilayer printed circuit boards. Thus, such multilayer printed circuit boards have allowed a large increase in the number of electrical signals that may be routed between electronic components mounted on the same circuit board.

The use of multilayer printed circuit boards has been particularly beneficial when using electronic components having high density packages. That is, electronic components having high density packages generally require multiple layers of a multilayer printed circuit board to make electrical connections with other electronic components mounted on the same circuit board. In fact, the density of electronic component packages typically dictate the number of layers that must be provided by the multilayer printed circuit board upon which the electronic component is mounted. While the number of layers that may be provided by a multilayer printed circuit board is theoretically unlimited, problems occur when the number of layers in a multilayer printed circuit board exceeds a reasonable number, particularly when trying to route high speed electrical signals between electronic components. For example, when making electrical connections between different layers in multilayer printed circuit boards, electrically conductive vias are generally used. While these electrically conductive vias allow direct vertical electrical connections to be made between different layers within a multilayer printed circuit board, there are intrinsic parasitics associated with these electrically conductive vias that can adversely affect the performance of signals propagating therethrough. That is, these electrically conductive vias have intrinsic parasitic resistance, capacitance, and inductance, which can adversely affect signals propagating along each electrically conductive via. In addition, these intrinsic parasitics can also have an adverse effect on the manufacturability of a printed circuit board and thus the cost thereof. Because of their adverse affect on signal performance, these intrinsic parasitics can also limit the bandwidth of signals propagating along each electrically conductive via. These adverse affects only increase as the number of layers in a multilayer printed circuit board increase.

In view of the foregoing, it would be desirable to provide a technique for increasing the number of electrical connections that may be made between electronic components mounted on a multilayer printed circuit board without increasing the number of layers in the multilayer printed circuit board. More particularly, it would be desirable to provide a technique for reducing the number of layers in a multilayer circuit board in an efficient and cost effective manner.

SUMMARY OF THE INVENTION

According to the present invention, a technique for reducing the number of layers in a multilayer circuit board is provided. The multilayer circuit board has a plurality of electrically conductive signal layers for routing electrical signals to and from at least one electronic component mounted on a surface of the multilayer circuit board. In a preferred embodiment, the technique is realized by forming a first plurality of electrically conductive vias in the multilayer circuit board extending from the surface of the multilayer circuit board to a first of the plurality of electrically conductive signal layers, wherein the first plurality of electrically conductive vias are arranged so as to form a channel in a second of the plurality of electrically conductive signal layers beneath the first plurality of electrically conductive vias. The first plurality of electrically conductive vias beneficially electrically connect the at least one electronic component to the first of the plurality of electrically conductive signal layers. A first plurality of electrical signals are routed on the first of the plurality of electrically conductive signal layers. A second plurality of electrical signals are routed on the second of the plurality of electrically conductive signal layers in the channel formed in the second of the plurality of electrically conductive signal layers. The present invention technique is particularly beneficial when the at least one electronic component comprises an electronic component having a high density surface mount package such as, for example, a surface mount grid array package.

In accordance with other aspects of the present invention, wherein the first plurality of electrically conductive vias are arranged so as to form channels in other ones of the plurality of electrically conductive signal layers beneath the first plurality of electrically conductive vias, subsequent pluralities of electrical signals may be routed on the other ones of the plurality of electrically conductive signal layers in the channels formed in the other ones of the plurality of electrically conductive signal layers until all electrical signals to and from the at least one electronic component have been routed.

In accordance with further aspects of the present invention, the plurality of electrically conductive signal layers are typically separated by at least one dielectric layer. Also, at least some of the plurality of electrically conductive signal layers are typically separated by at least one electrically conductive power/ground plane layer. Further, the surface of the multilayer circuit board is typically primarily an electrically conductive power/ground plane layer.

In accordance with still further aspects of the present invention, a second plurality of electrically conductive vias may be formed in the multilayer circuit board extending from the surface of the multilayer circuit board to other ones of the plurality of electrically conductive signal layers. The second plurality of electrically conductive vias beneficially electrically connect the at least one electronic component to the other ones of the plurality of electrically conductive signal layers.

In accordance with still further aspects of the present invention, the first plurality of electrical signals to be routed on the first of the plurality of electrically conductive signal layers are preselected. The first plurality of electrical signals to be routed on the first of the plurality of electrically conductive signal layers may be preselected based upon a variety of signal characteristics. For example, the preselected electrical signals may be low speed electrical signals. Alternatively, the preselected electrical signals may be high speed electrical signals.

The present invention will now be described in more detail with reference to exemplary embodiments thereof as shown in the appended drawings. While the present invention is described below with reference to preferred embodiments, it should be understood that the present invention is not limited thereto. Those of ordinary skill in the art having access to the teachings herein will recognize additional implementations, modifications, and embodiments, as well as other fields of use, which are within the scope of the present invention as disclosed and claimed herein, and with respect to which the present invention could be of significant utility.

BRIEF DESCRIPTION OF THE DRAWINGS

In order to facilitate a more full understanding of the present invention, reference is now made to the appended drawings. These drawings should not be construed as limiting the present invention, but are intended to be exemplary only.

DETAILED DESCRIPTION OF EXEMPLARY EMBODIMENT(S)

Figure 1:
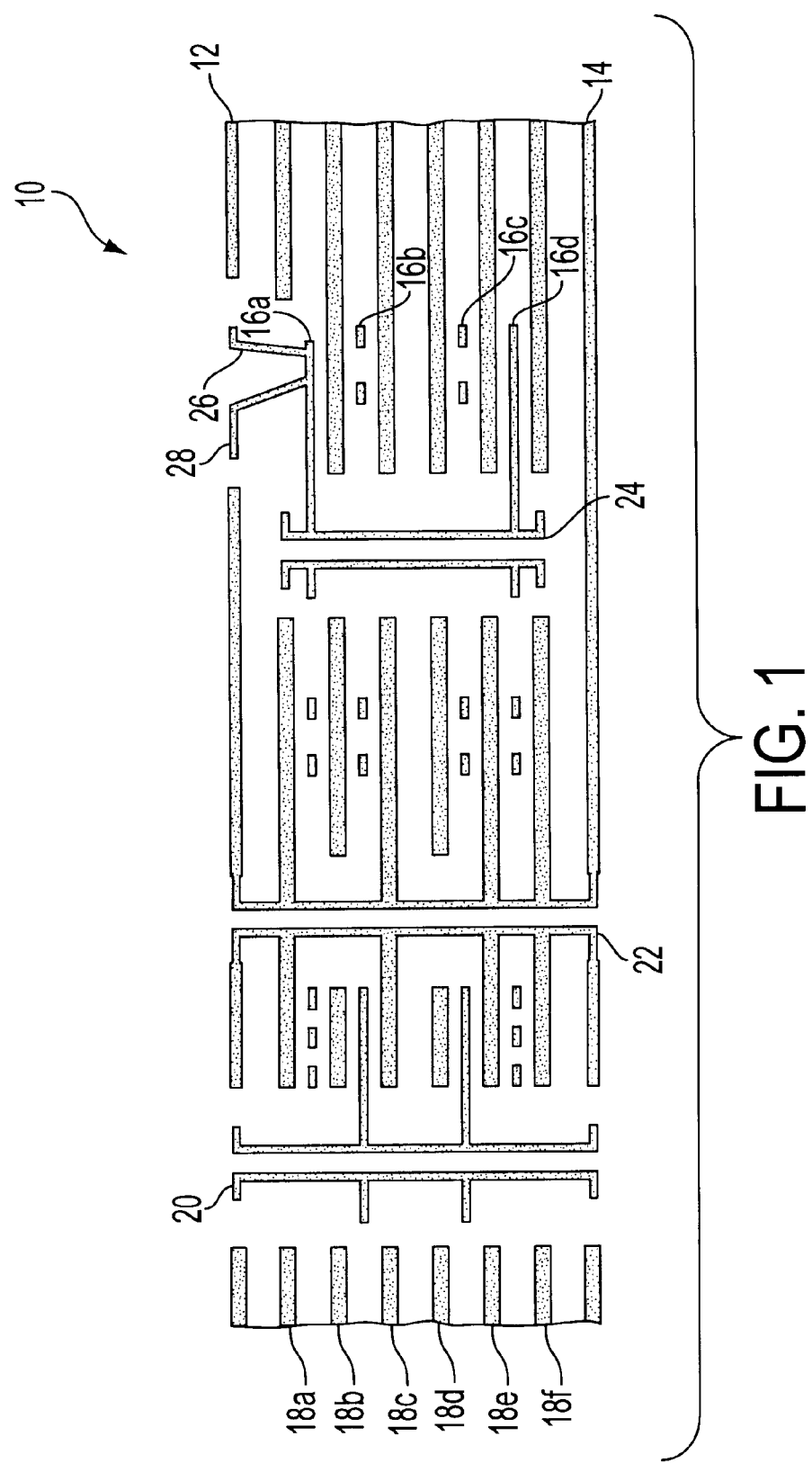
FIG. 1 is a side cross-sectional view of a multilayer printed circuit board in accordance with the present invention.

Referring to FIG. 1, there is shown a side cross-sectional view of a multilayer printed circuit board 10 in accordance with the present invention. That is, the multilayer printed circuit board 10 incorporates the concepts of the present invention so as to reduce the number of layers in the multilayer printed circuit board 10.

The multilayer printed circuit board 10 comprises a primary (top) layer 12, a secondary (bottom) layer 14, a plurality of signal layers 16, and a plurality of power/ground plane layers 18. It should be noted that the primary layer 12 and the secondary layer 14 are primarily power/ground plane layers except for contact pads and test signal runs formed thereon, as will be described in more detail below.

The multilayer printed circuit board 10 also comprises a first supervia 20 for electrically connecting selected ones of the plurality of signal layers 16 (i.e., signal layers 16b and 16c), a second supervia 22 for electrically connecting the primary layer 12, the secondary layer 14, and selected ones of the plurality of power/ground plane layers 18 (i.e., power/ground plane layers 18a, 18c, 18e, and 18f), a buried via 24 for electrically connecting selected ones of the plurality of signal layers 16 (i.e., signal layers 16a and 16d), and a microvia 26 for electrically connecting signal layer 16a to a contact pad 28 formed on the primary layer 12. It should be noted that the microvia 26 could also be a via-in-pad, or some other similar non-through-hole via. It should also be noted that it is the microvia 26 (or substantial equivalent thereof) which allows the present invention technique to be realized, as will now be described in more detail with reference to FIGS. 2–15, of which FIGS. 4–15 correspond to the twelve layers of the multilayer printed circuit board 10.

Figure 2:
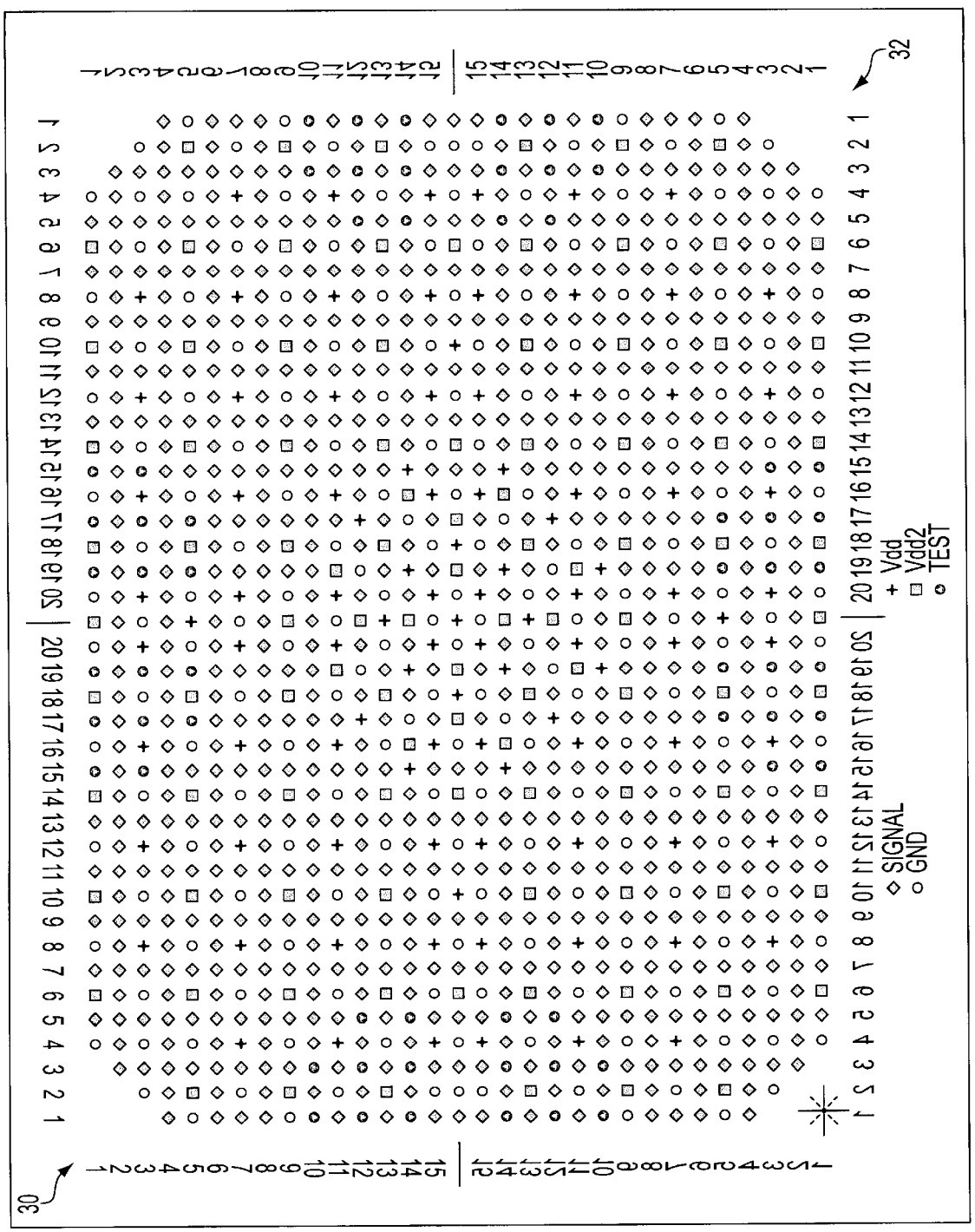
FIG. 2 shows a layout of a surface mount grid array package of an electronic component having 1247 input/output (I/O) contacts.

Referring to FIG. 2, there is shown a layout 30 of a surface mount grid array package of an electronic component having 1247 input/output (I/O) contacts. FIG. 2 also shows a legend indicating the type of signal associated with I/O contact.

Figure 3:
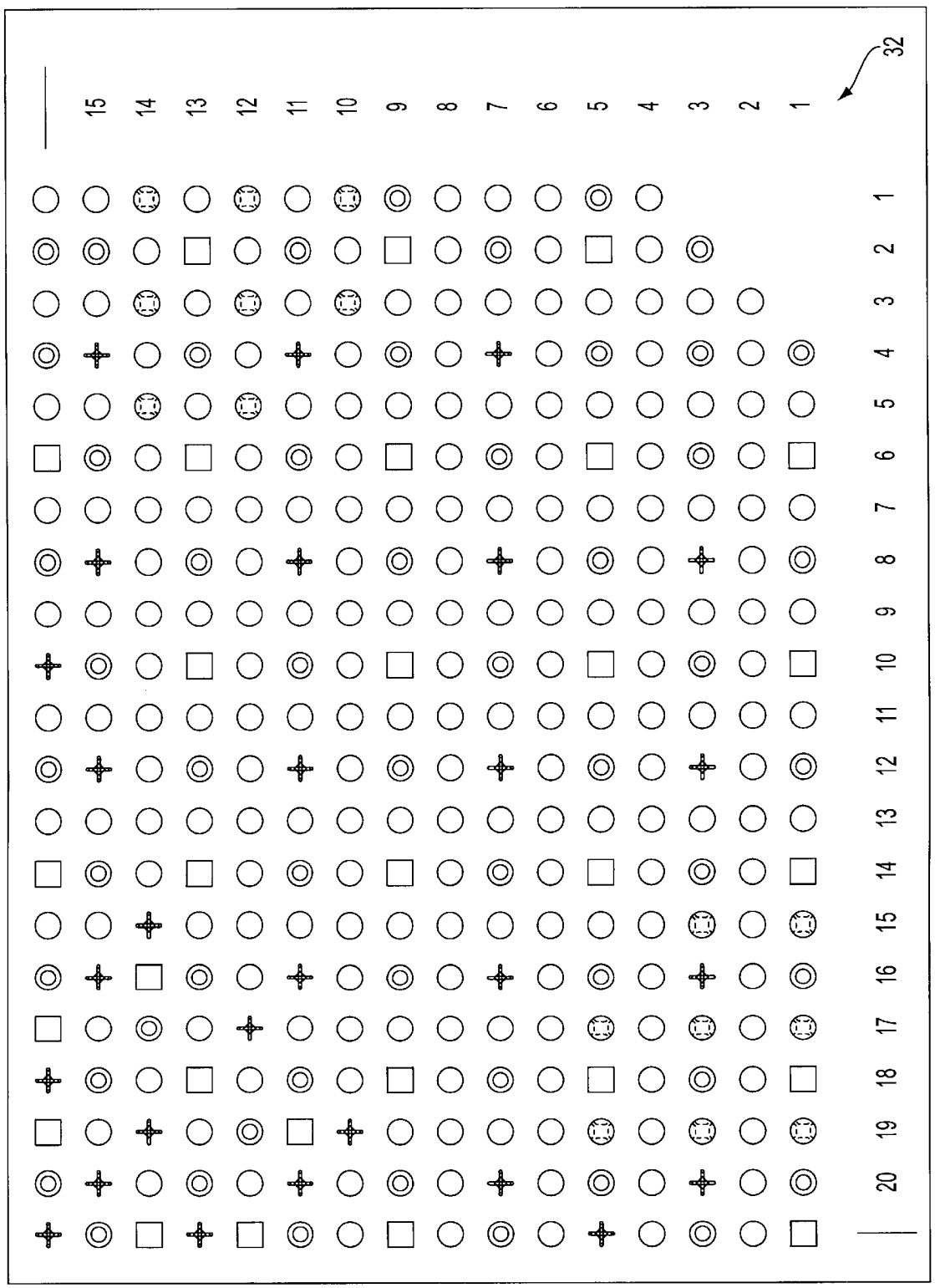
FIG. 3 shows one quadrant (i.e., the lower right quadrant) of the layout shown in FIG. 2.

In order to increase the resolution for purposes of better understanding this detailed description, FIG. 3 shows one quadrant 32 (i.e., the lower right quadrant) of the layout 30 shown in FIG. 2. FIGS. 4–15 directly coincide with the quadrant 32 shown in FIG. 3. The signal type legend in FIG. 2 also applies to FIG. 3, as well as to FIGS. 4–15.

Figure 4:
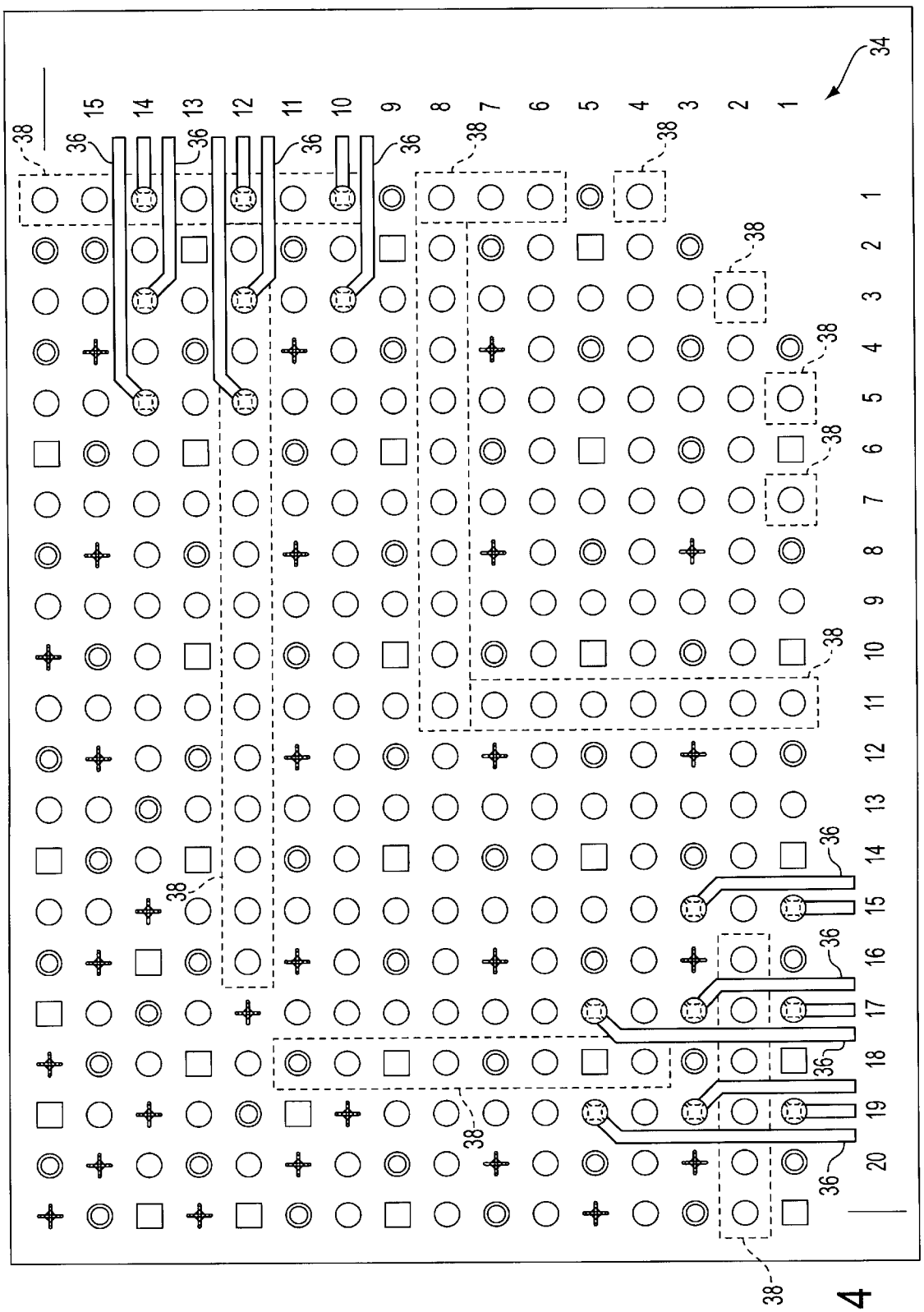
FIG. 4 shows a portion of the primary layer of the multilayer printed circuit board shown in FIG. 1.

Referring to FIG. 4, there is shown a portion 34 of the primary layer 12 of the multilayer printed circuit board 10. As indicated above, this portion 34 of the primary layer 12 directly coincides with the quadrant 32 shown in FIG. 3. That is, this portion 34 of the primary layer 12 corresponds to the portion of the multilayer printed circuit board 10 where one quadrant of an electronic component having a surface mount grid array package with 1247 I/O contacts is mounted on the multilayer printed circuit board 10.

As indicated above, the primary layer 12 is primarily a power/ground plane layer except for contact pads and test signal runs formed thereon. More particularly, the primary layer 12 includes a ground plane that is electrically connected to ground contact pads (i.e., GND in legend), but is not electrically connected to power contact pads (i.e., Vdd and Vdd2 in legend), signal contact pads (i.e., signal in legend), or test contact pads (i.e., test in legend). The ground plane of the primary layer 12 is also not electrically connected to a plurality of test signal runs 36 formed on the primary layer 12.

Also shown in FIG. 4 are areas 38 of the multilayer printed circuit board 10 where channels are formed in other layers of the multilayer printed circuit board 10 in accordance with the present invention. These areas 38 also indicate where microvias or via-in-pads are formed in the multilayer printed circuit board 10. That is, all of the contact pads within these areas 38 are formed as microvias or via-in-pads for facilitating the formation of channels in other layers of the multilayer printed circuit board 10 in accordance with the present invention, as described in detail below.

Figure 5:
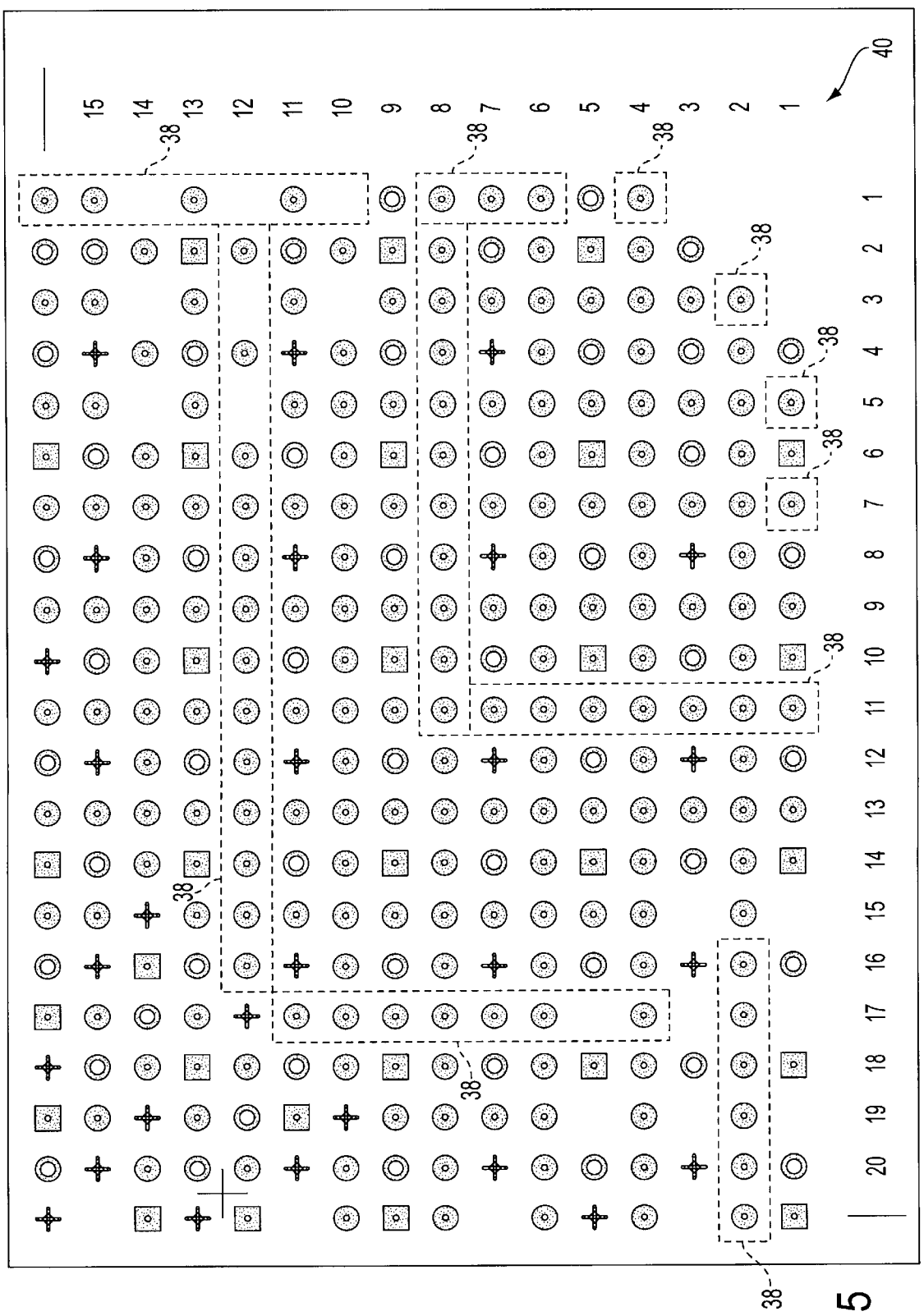
FIG. 5 shows a portion of a first power/ground plane layer of the multilayer printed circuit board shown in FIG. 1.

Referring to FIG. 5, there is shown a portion 40 of the power/ground plane layer 18a of the multilayer printed circuit board 10. As indicated above, this portion 40 of the power/ground plane layer 18a directly coincides with the quadrant 32 shown in FIG. 3. That is, this portion 40 of the power/ground plane layer 18a corresponds to the portion of the multilayer printed circuit board 10 where one quadrant of an electronic component having a surface mount grid array package with 1247 I/O contacts is mounted on the multilayer printed circuit board 10.

The power/ground plane layer 18a is primarily a ground plane layer except for vias formed therein. More particularly, the power/ground layer 18a includes a ground plane that is electrically connected to ground vias (i.e., GND in legend), but is not electrically connected to power vias (i.e., Vdd and Vdd2 in legend) or signal vias (i.e., signal in legend). Note that there are no test vias formed in the power/ground plane layer 18a as test contact pads and test signal runs are typically only formed on the primary layer 12.

Also shown in FIG. 5 are the areas 38 of the multilayer printed circuit board 10 where channels are formed in other layers of the multilayer printed circuit board 10 in accordance with the present invention. Again, these areas 38 also indicate where microvias or via-in-pads are formed in the multilayer printed circuit board 10. That is, all of the vias within these areas 38 are formed as microvias or via-in-pads for facilitating the formation of channels in other layers of the multilayer printed circuit board 10 in accordance with the present invention, as described in detail below.

Figure 6:
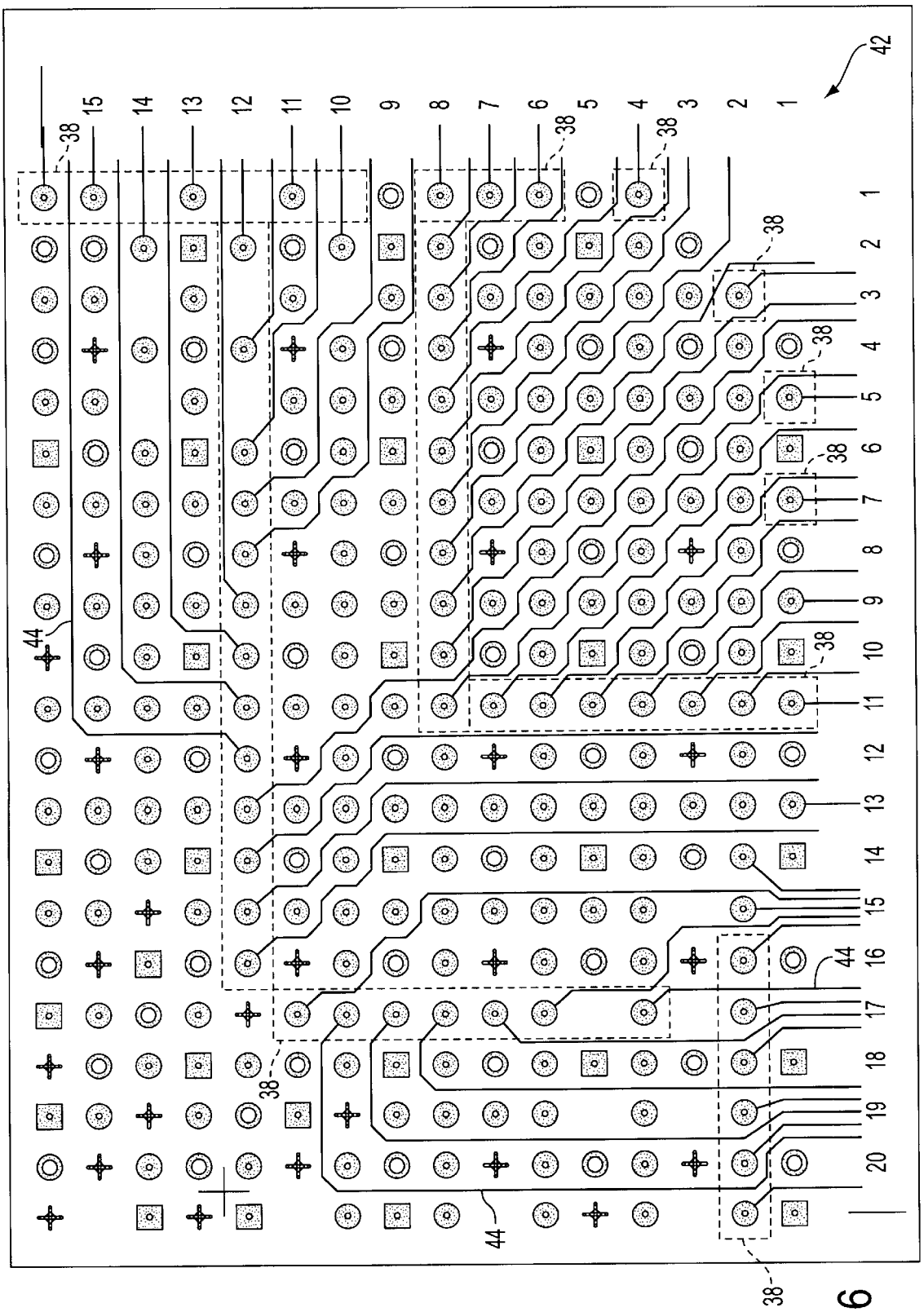
FIG. 6 shows a portion of a first signal layer of the multilayer printed circuit board shown in FIG. 1.

Referring to FIG. 6, there is shown a portion 42 of the signal layer 16a of the multilayer printed circuit board 10. As indicated above, this portion 42 of the signal layer 16a directly coincides with the quadrant 32 shown in FIG. 3. That is, this portion 42 of the power/ground plane layer 18a corresponds to the portion of the multilayer printed circuit board 10 where one quadrant of an electronic component having a surface mount grid array package with 1247 I/O contacts is mounted on the multilayer printed circuit board 10.

The signal layer 16a includes a plurality of electrically conductive signal runs 44 that are electrically connected to the microvias or via-in-pads in the areas 38 of the multilayer printed circuit board 10 where channels are formed in other layers of the multilayer printed circuit board 10 in accordance with the present invention. These signal runs 44 are typically preselected based upon the characteristics of the signals they carry. That is, the signals runs 44 may carry high speed signals. Alternatively, the signals runs 44 may carry low speed signals. Importantly, the microvias or via-in-pads that are formed in the areas 38 of the multilayer printed circuit board 10 do not extend any further into the multilayer printed circuit board 10 than the signal layer 16a. This allows channels to be formed beneath these microvias or via-in-pads in other layers of the multilayer printed circuit board 10, as described in detail below.

Figure 7:
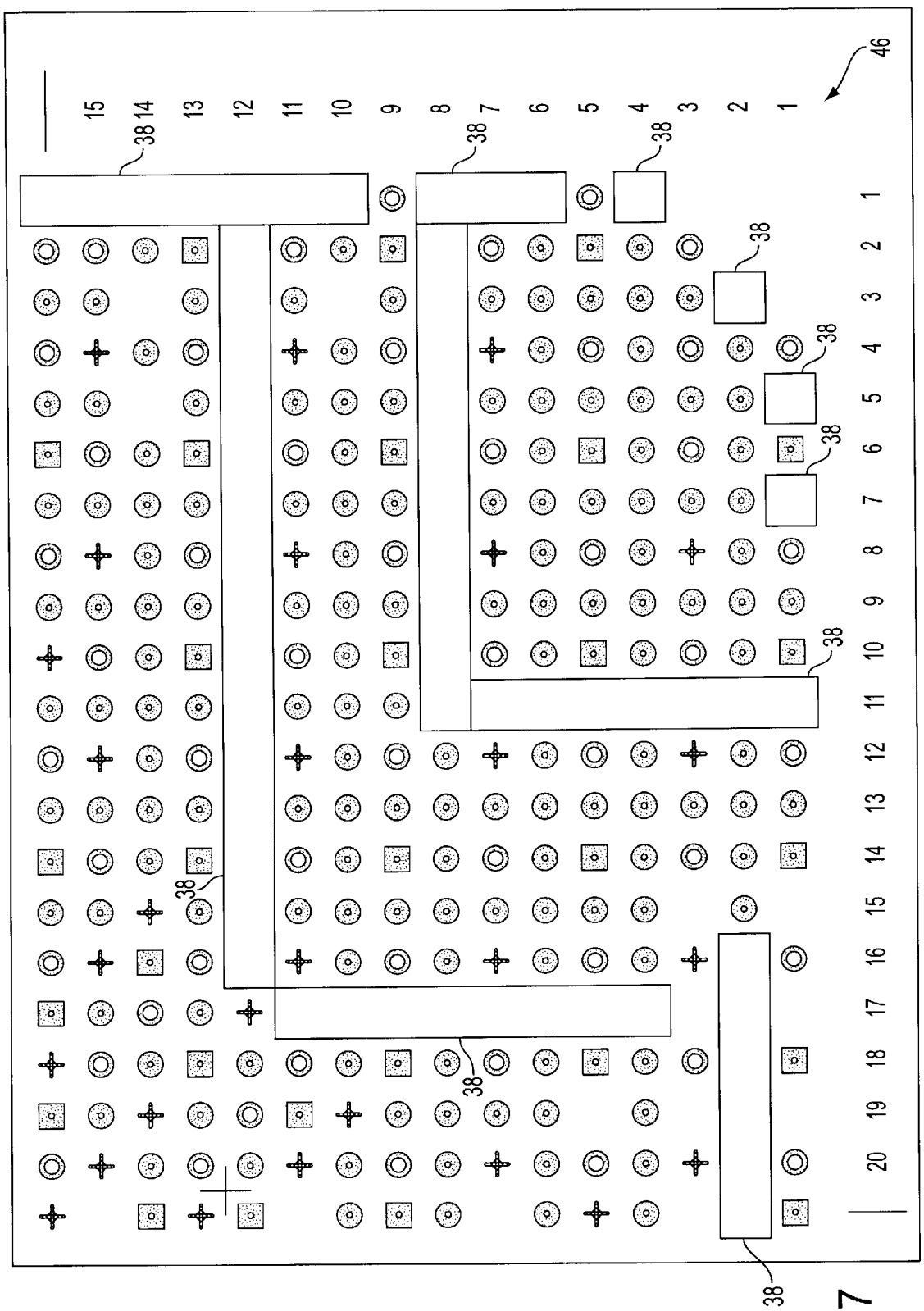
FIG. 7 shows a portion of a second power/ground plane layer of the multilayer printed circuit board shown in FIG. 1.

Referring to FIG. 7, there is shown a portion 46 of the power/ground plane layer 18b of the multilayer printed circuit board 10. As indicated above, this portion 46 of the power/ground plane layer 18b directly coincides with the quadrant 32 shown in FIG. 3. That is, this portion 46 of the power/ground plane layer 18b corresponds to the portion of the multilayer printed circuit board 10 where one quadrant of an electronic component having a surface mount grid array package with 1247 I/O contacts is mounted on the multilayer printed circuit board 10.

The power/ground plane layer 18b is primarily a power plane layer except for vias formed therein. More particularly, the power/ground layer 18b includes a power plane that is electrically connected to power vias (i.e., Vdd in legend), but is not electrically connected to round vias (i.e., GND in legend) or signal vias (i.e., signal in legend). Note that there are no test vias formed in the power/ground plane layer 18b as test contact pads and test signal runs are typically only formed on the primary layer 12. Also note that there are no vias formed in the power/ground plane layer 18b in the areas 38 of the multilayer printed circuit board 10, thereby forming channels in these areas 38 in this and other layers of the multilayer printed circuit board 10 in accordance with the present invention. These areas 38 of the multilayer printed circuit board 10 are devoid of vias in the power/ground plane layer 18b because microvias or via-in-pads are only formed in these areas 38 of the multilayer printed circuit board 10 extending from the primary layer 12 to the signal layer 16a, as described above.

Figure 8:
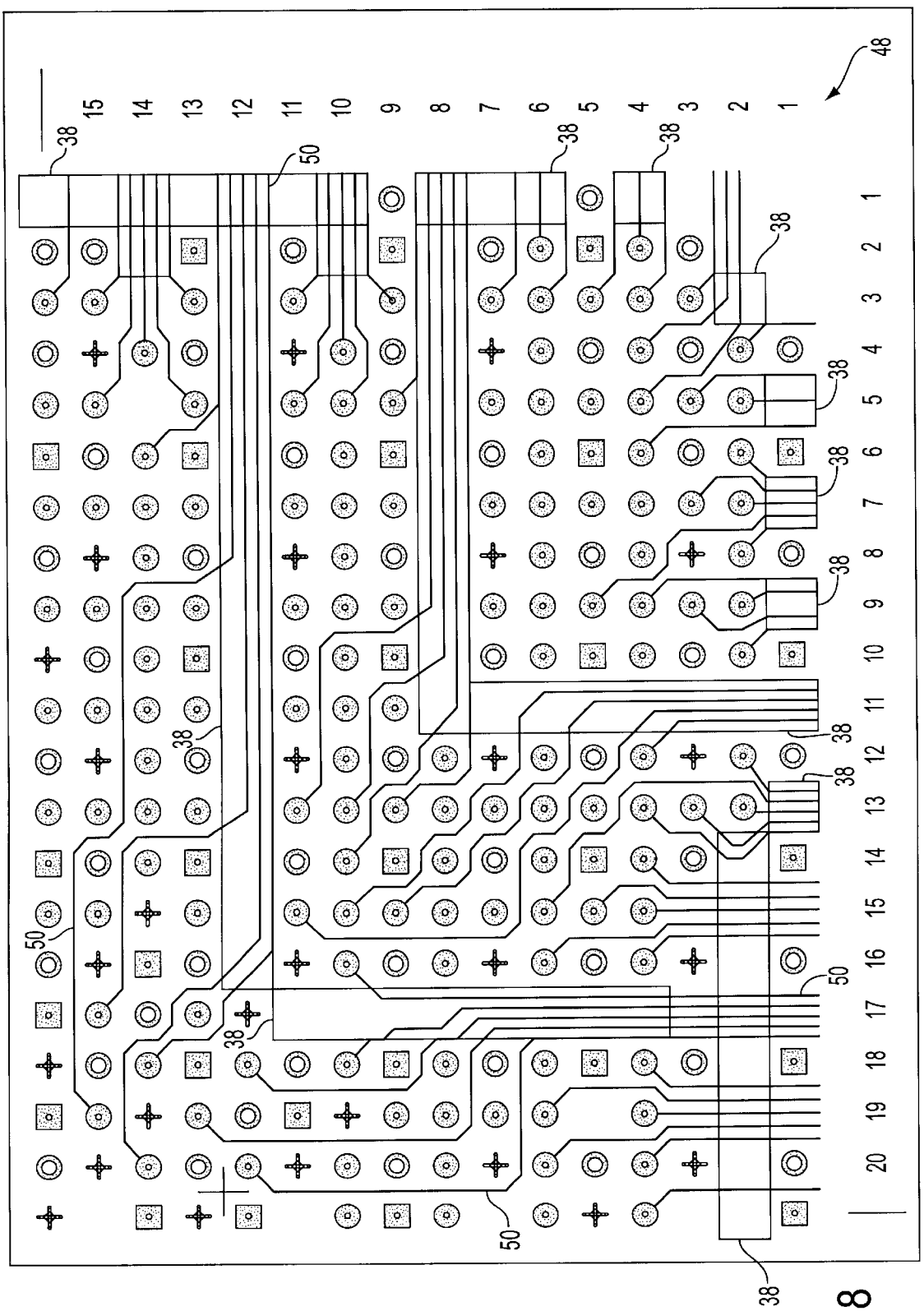
FIG. 8 shows a portion of a second signal layer of the multilayer printed circuit board shown in FIG. 1.

Referring to FIG. 8, there is shown a portion 48 of the signal layer 16b of the multilayer printed circuit board 10. As indicated above, this portion 48 of the signal layer 16b directly coincides with the quadrant 32 shown in FIG. 3. That is, this portion 48 of the signal layer 16b corresponds to the portion of the multilayer printed circuit board 10 where one quadrant of an electronic component having a surface mount grid array package with 1247 I/O contacts is mounted on the multilayer printed circuit board 10.

The signal layer 16b includes a plurality of electrically conductive signal runs 50 that are electrically connected to vias formed in the signal layer 16b outside the areas 38 of the multilayer printed circuit board 10 where channels are formed in this and other layers of the multilayer printed circuit board 10. In accordance with the present invention, many of these signal runs 50 are routed in these channels. That is, the channels formed by the absence of vias in the signal layer 16b in the areas 38 of the multilayer printed circuit board 10 allow the plurality of electrically conductive signal runs 50 to be routed therein. Otherwise, if vias were present in these areas 38 in this and other layers of the multilayer printed circuit board 10, then additional signal layers would be required to route the plurality of electrically conductive signal runs 50. Thus, the absence of vias in these areas 38 in this and other layers of the multilayer printed circuit board 10 allow for an overall reduction in the number of signal layers required in the multilayer printed circuit board 10.

At this point it should be noted that the channels formed in the areas 38 of the multilayer printed circuit board 10 are beneficially arranged so as to intersect at least one edge of the grid array. The benefit of this arrangement is to allow the plurality of electrically conductive signal runs 50 to be more easily routed out from within the grid array. In fact, as shown in FIG. 8, some of the channels formed in the areas 38 of the multilayer printed circuit board 10 intersect more than one edge of the grid array. These multiple edge intersecting channels are typically formed of orthogonal columns and rows, but may also be formed in diagonal or random patterns.

It should also be noted that the channels formed in the areas 38 of the multilayer printed circuit board 10 may have varying widths. That is, while the channels formed in the areas 38 of the multilayer printed circuit board 10 are shown in FIG. 8 as having a width of one contact pad or via, the present invention is not limited in this regard. For example, the channels formed in the areas 38 of the multilayer printed circuit board 10 can be two or more contact pads or vias wide depending upon how many microvias or via-in-pads are used and how many vias are removed in accordance with the practices of the present invention as described above.

Figure 9:
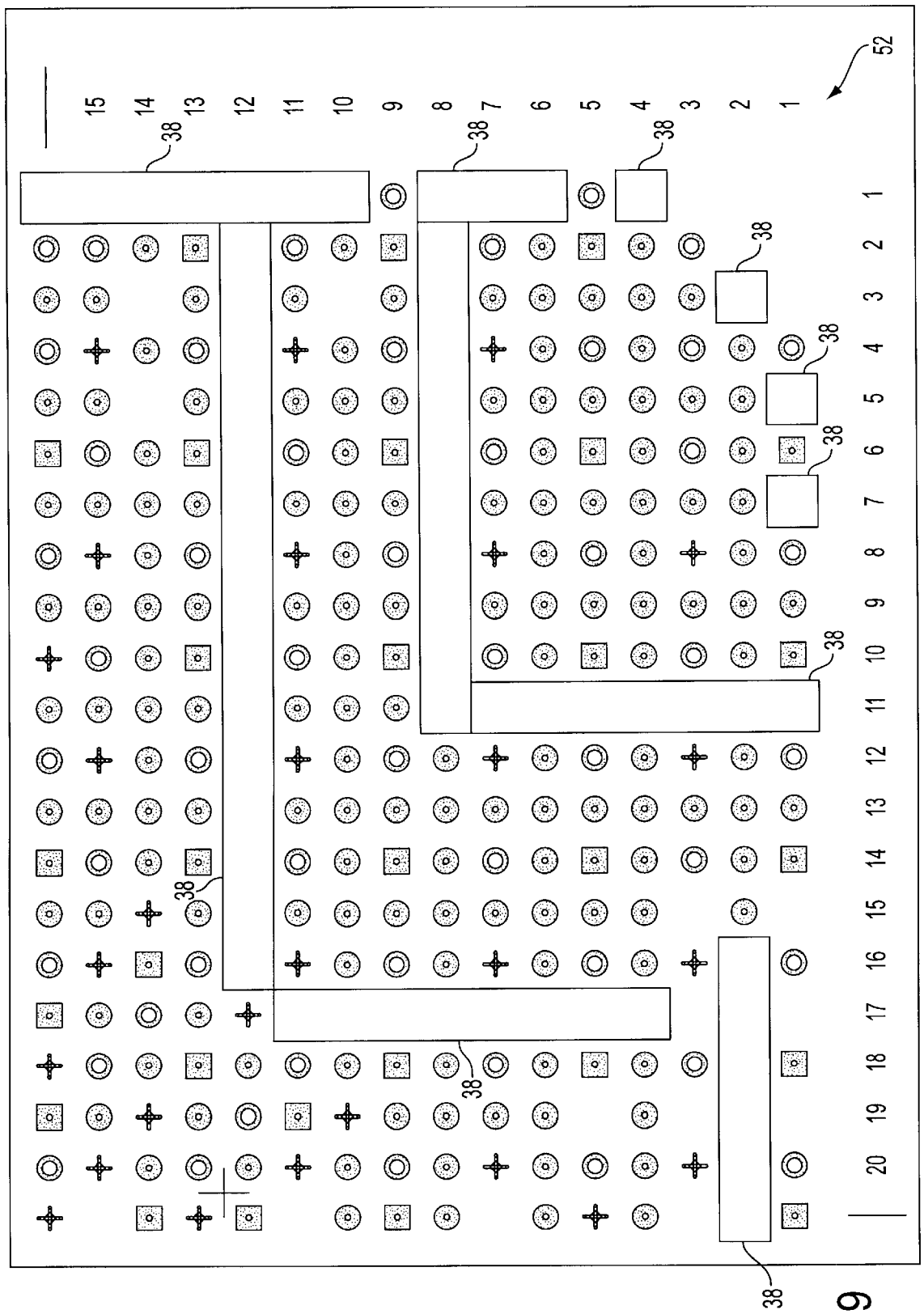
FIG. 9 shows a portion of a third power/ground plane layer of the multilayer printed circuit board shown in FIG. 1.

Referring to FIG. 9, there is shown a portion 52 of the power/ground plane layer 18c of the multilayer printed circuit board 10. As indicated above, this portion 52 of the power/ground plane layer 18c directly coincides with the quadrant 32 shown in FIG. 3. That is, this portion 52 of the power/ground plane layer 18c corresponds to the portion of the multilayer printed circuit board 10 where one quadrant of an electronic component having a surface mount grid array package with 1247 I/O contacts is mounted on the multilayer printed circuit board 10.

The power/ground plane layer 18c is primarily a ground plane layer except for vias formed therein. More particularly, the power/ground layer 18c includes a ground plane that is electrically connected to ground vias (i.e., GND in legend), but is not electrically connected to power vias (i.e., Vdd and Vdd2 in legend) or signal vias (i.e., signal in legend). Note that there are no test vias formed in the power/ground plane layer 18c as test contact pads and test signal runs are typically only formed on the primary layer 12. Also note that there are no vias formed in the power/ground plane layer 18c in the areas 38 of the multilayer printed circuit board 10, thereby forming channels in these areas 38 in this and other layers of the multilayer printed circuit board 10 in accordance with the present invention. These areas 38 of the multilayer printed circuit board 10 are devoid of vias in the power/ground plane layer 18c because microvias or via-in-pads are only formed in these areas 38 of the multilayer printed circuit board 10 extending from the primary layer 12 to the signal layer 16a, as described above.

Figure 10:
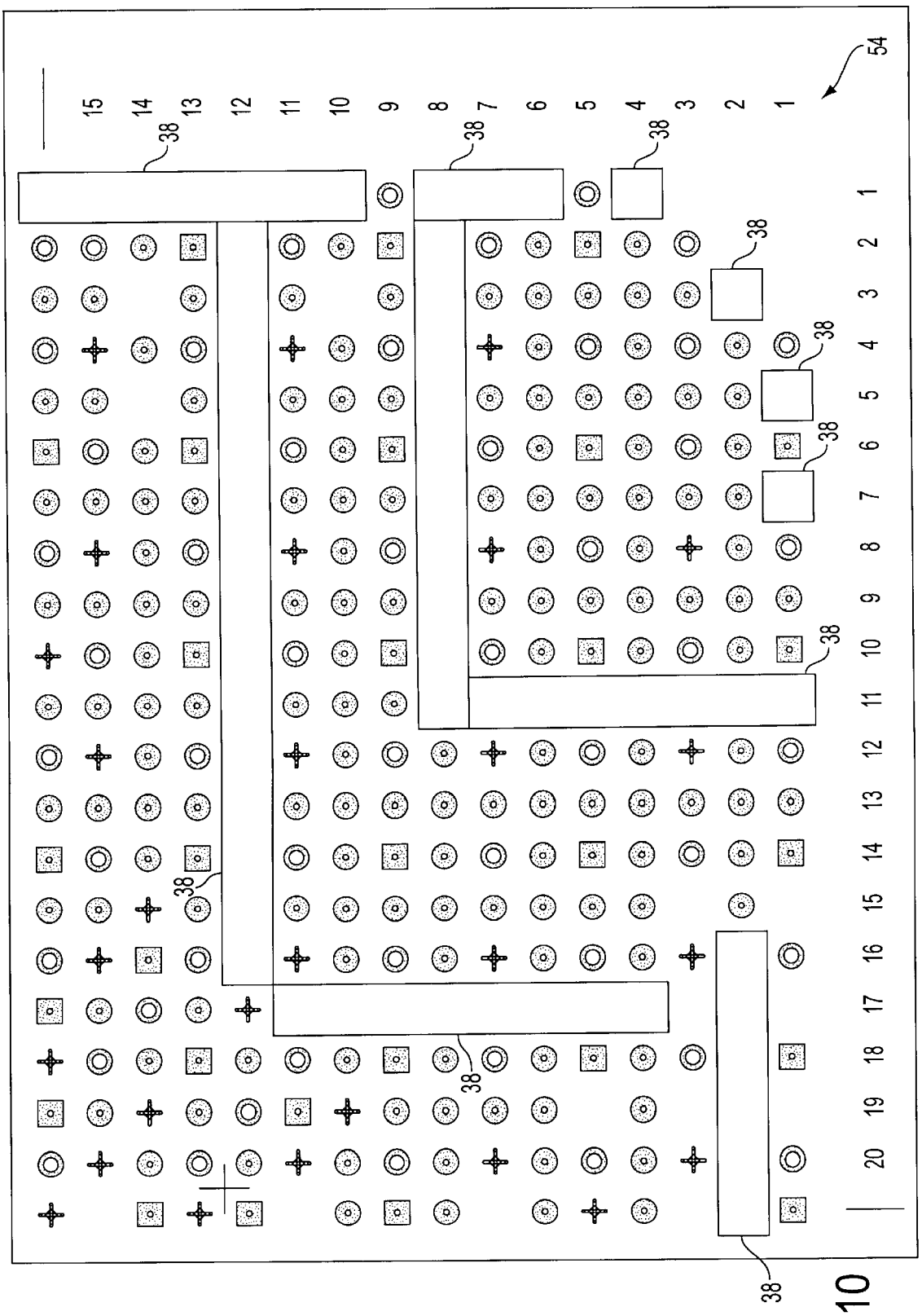
FIG. 10 shows a portion of a fourth power/ground plane layer of the multilayer printed circuit board shown in FIG. 1.

Referring to FIG. 10, there is shown a portion 54 of the power/ground plane layer 18d of the multilayer printed circuit board 10. As indicated above, this portion 54 of the power/ground plane layer 18d directly coincides with the quadrant 32 shown in FIG. 3. That is, this portion 54 of the power/ground plane layer 18d corresponds to the portion of the multilayer printed circuit board 10 where one quadrant of an electronic component having a surface mount grid array package with 1247 I/O contacts is mounted on the multilayer printed circuit board 10.

Similar to power/ground plane layer 18b, the power/ground plane layer 18d is primarily a power plane layer except for vias formed therein. More particularly, the power/ground layer 18d includes a power plane that is electrically connected to power vias (i.e., Vdd2 in legend), but is not electrically connected to ground vias (i.e., GND in legend) or signal vias (i.e., signal in legend). Note that there are no test vias formed in the power/ground plane layer 18d as test contact pads and test signal runs are typically only formed on the primary layer 12. Also note that there are no vias formed in the power/ground plane layer 18d in the areas 38 of the multilayer printed circuit board 10, thereby forming channels in these areas 38 in this and other layers of the multilayer printed circuit board 10 in accordance with the present invention. These areas 38 of the multilayer printed circuit board 10 are devoid of vias in the power/ground plane layer 18d because microvias or via-in-pads are only formed in these areas 38 of the multilayer printed circuit board 10 extending from the primary layer 12 to the signal layer 16a, as described above.

Figure 11:
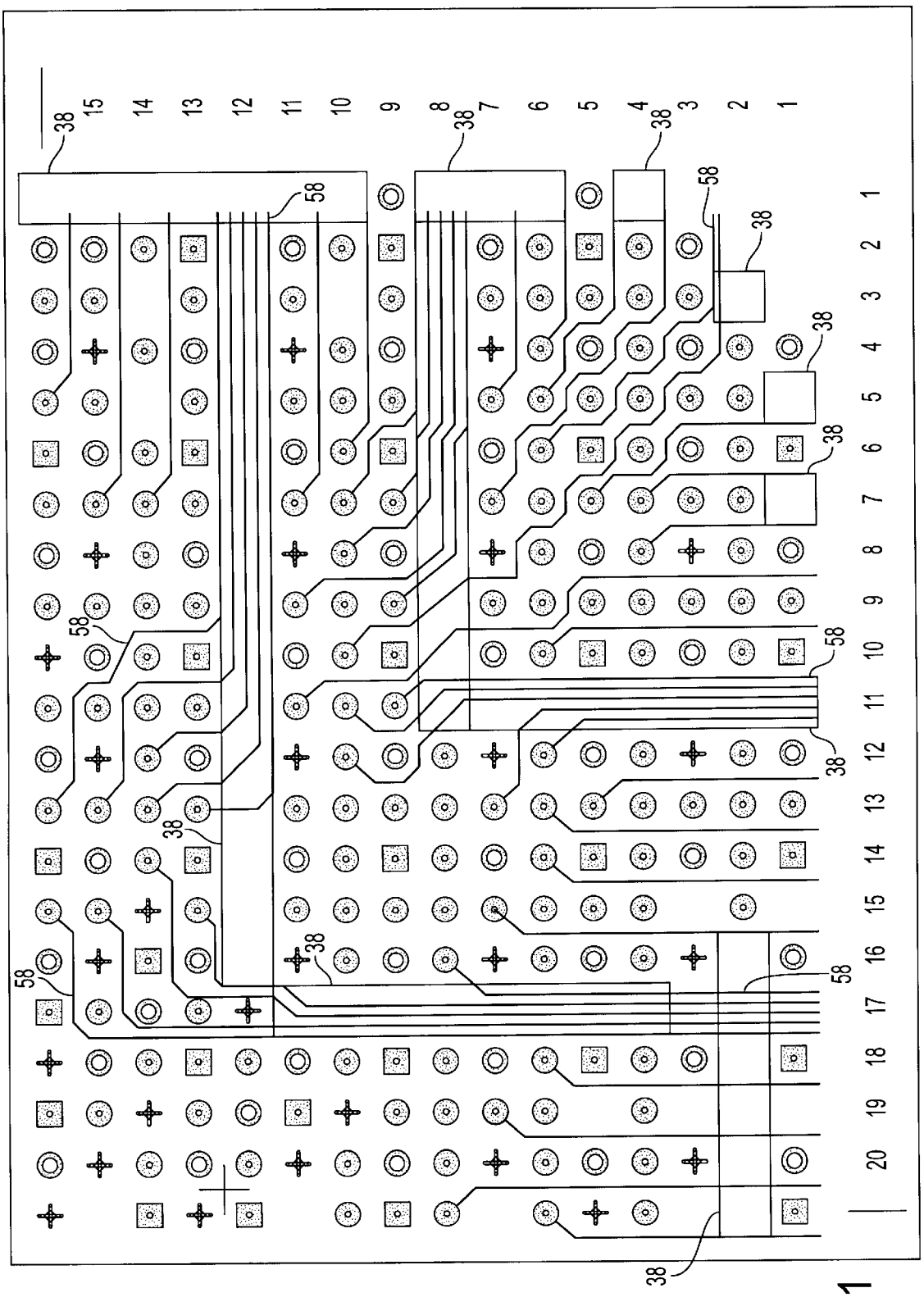
FIG. 11 shows a portion of a third signal layer of the multilayer printed circuit board shown in FIG. 1.

Referring to FIG. 11, there is shown a portion 56 of the signal layer 16c of the multilayer printed circuit board 10. As indicated above, this portion 56 of the signal layer 16c directly coincides with the quadrant 32 shown in FIG. 3. That is, this portion 56 of the signal layer 16c corresponds to the portion of the multilayer printed circuit board 10 where one quadrant of an electronic component having a surface mount grid array package with 1247 I/O contacts is mounted on the multilayer printed circuit board 10.

The signal layer 16c includes a plurality of electrically conductive signal runs 58 that are electrically connected to vias formed in the signal layer 16c outside the areas 38 of the multilayer printed circuit board 10 where channels are formed in this and other layers of the multilayer printed circuit board 10. In accordance with the present invention, many of these signal runs 58 are routed in these channels. That is, the channels formed by the absence of vias in the signal layer 16c in the areas 38 of the multilayer printed circuit board 10 allow the plurality of electrically conductive signal runs 58 to be routed therein. Otherwise, if vias were present in these areas 38 in this and other layers of the multilayer printed circuit board 10, then additional signal layers would be required to route the plurality of electrically conductive signal runs 58. Thus, the absence of vias in these areas 38 in this and other layers of the multilayer printed circuit board 10 allow for an overall reduction in the number of signal layers required in the multilayer printed circuit board 10.

Figure 12:
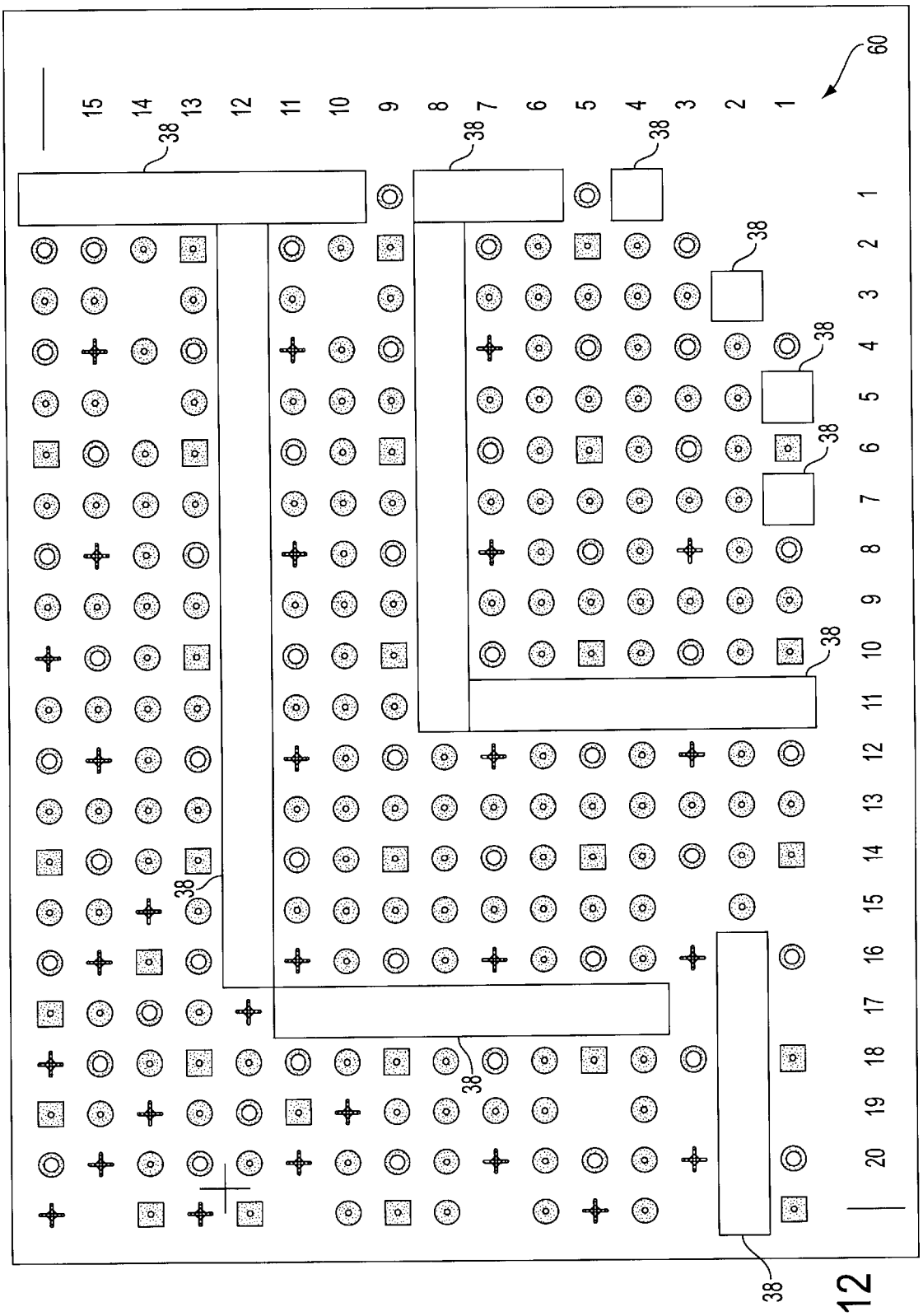
FIG. 12 shows a portion of a fifth power/ground plane layer of the multilayer printed circuit board shown in FIG. 1.

Referring to FIG. 12, there is shown a portion 60 of the power/ground plane layer 18e of the multilayer printed circuit board 10. As indicated above, this portion 60 of the power/ground plane layer 18e directly coincides with the quadrant 32 shown in FIG. 3. That is, this portion 60 of the power/ground plane layer 18e corresponds to the portion of the multilayer printed circuit board 10 where one quadrant of an electronic component having a surface mount grid array package with 1247 I/O contacts is mounted on the multilayer printed circuit board 10.

Similar to power/ground plane layer 18c, the power/ground plane layer 18e is primarily a ground plane layer except for vias formed therein. More particularly, the power/ground layer 18e includes a ground plane that is electrically connected to ground vias (i.e., GND in legend), but is not electrically connected to power vias (i.e., Vdd and Vdd2 in legend) or signal vias (i.e., signal in legend). Note that there are no test vias formed in the power/ground plane layer 18e as test contact pads and test signal runs are typically only formed on the primary layer 12. Also note that there are no vias formed in the power/ground plane layer 18e in the areas 38 of the multilayer printed circuit board 10, thereby forming channels in these areas 38 in this and other layers of the multilayer printed circuit board 10 in accordance with the present invention. These areas 38 of the multilayer printed circuit board 10 are devoid of vias in the power/ground plane layer 18e because microvias or via-in-pads are only formed in these areas 38 of the multilayer printed circuit board 10 extending from the primary layer 12 to the signal layer 16a, as described above.

Figure 13:
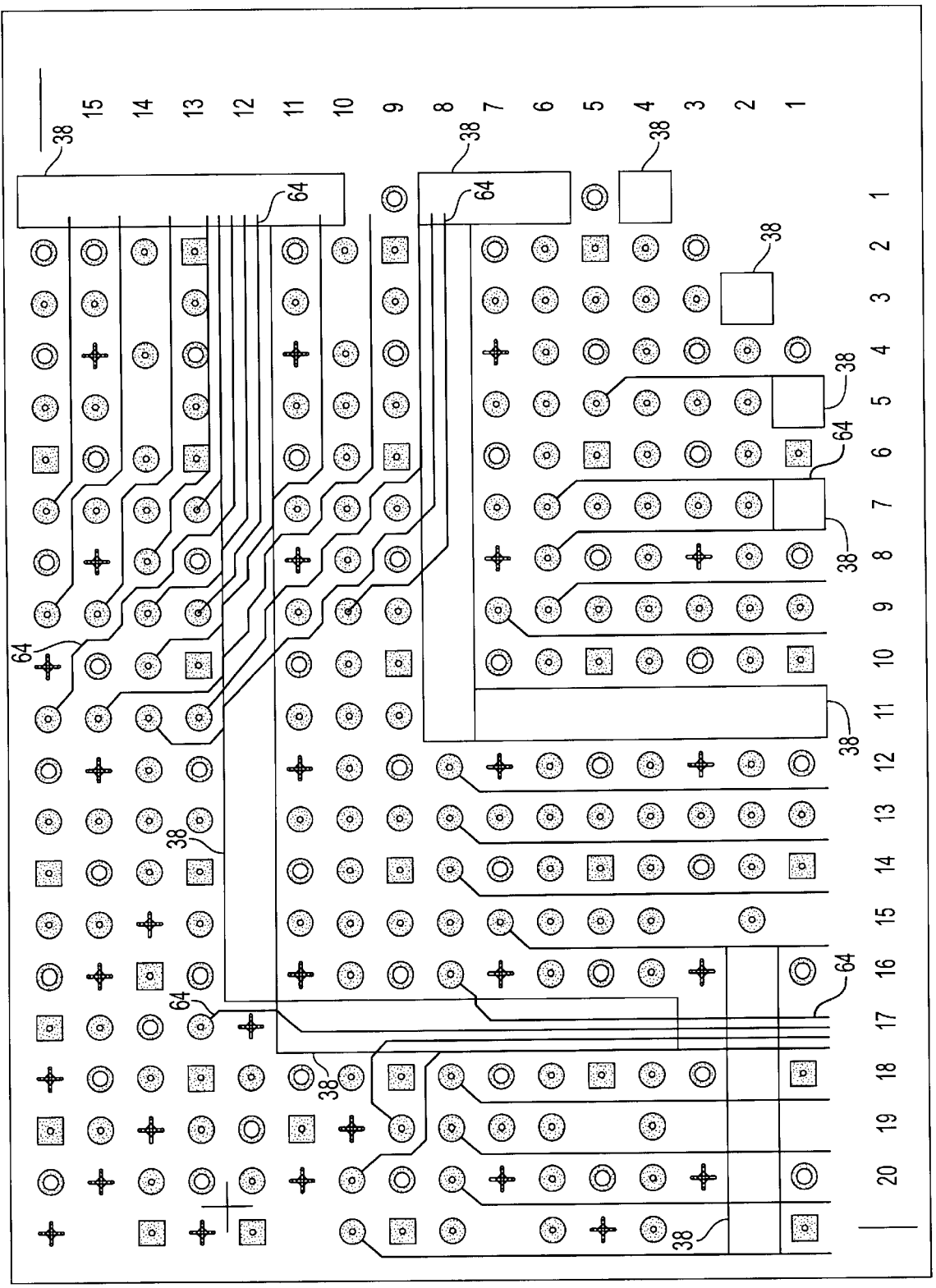
FIG. 13 shows a portion of a fourth signal layer of the multilayer printed circuit board shown in FIG. 1.

Referring to FIG. 13, there is shown a portion 62 of the signal layer 16d of the multilayer printed circuit board 10. As indicated above, this portion 62 of the signal layer 16d directly coincides with the quadrant 32 shown in FIG. 3. That is, this portion 62 of the signal layer 16d corresponds to the portion of the multilayer printed circuit board 10 where one quadrant of an electronic component having a surface mount grid array package with 1247 I/O contacts is mounted on the multilayer printed circuit board 10.

The signal layer 16d includes a plurality of electrically conductive signal runs 64 that are electrically connected to vias formed in the signal layer 16d outside the areas 38 of the multilayer printed circuit board 10 where channels are formed in this and other layers of the multilayer printed circuit board 10. In accordance with the present invention, many of these signal runs 64 are routed in these channels. That is, the channels formed by the absence of vias in the signal layer 16d in the areas 38 of the multilayer printed circuit board 10 allow the plurality of electrically conductive signal runs 64 to be routed therein. Otherwise, if vias were present in these areas 38 in this and other layers of the multilayer printed circuit board 10, then additional signal layers would be required to route the plurality of electrically conductive signal runs 64. Thus, the absence of vias in these areas 38 in this and other layers of the multilayer printed circuit board 10 allow for an overall reduction in the number of signal layers required in the multilayer printed circuit board 10.

Figure 14:
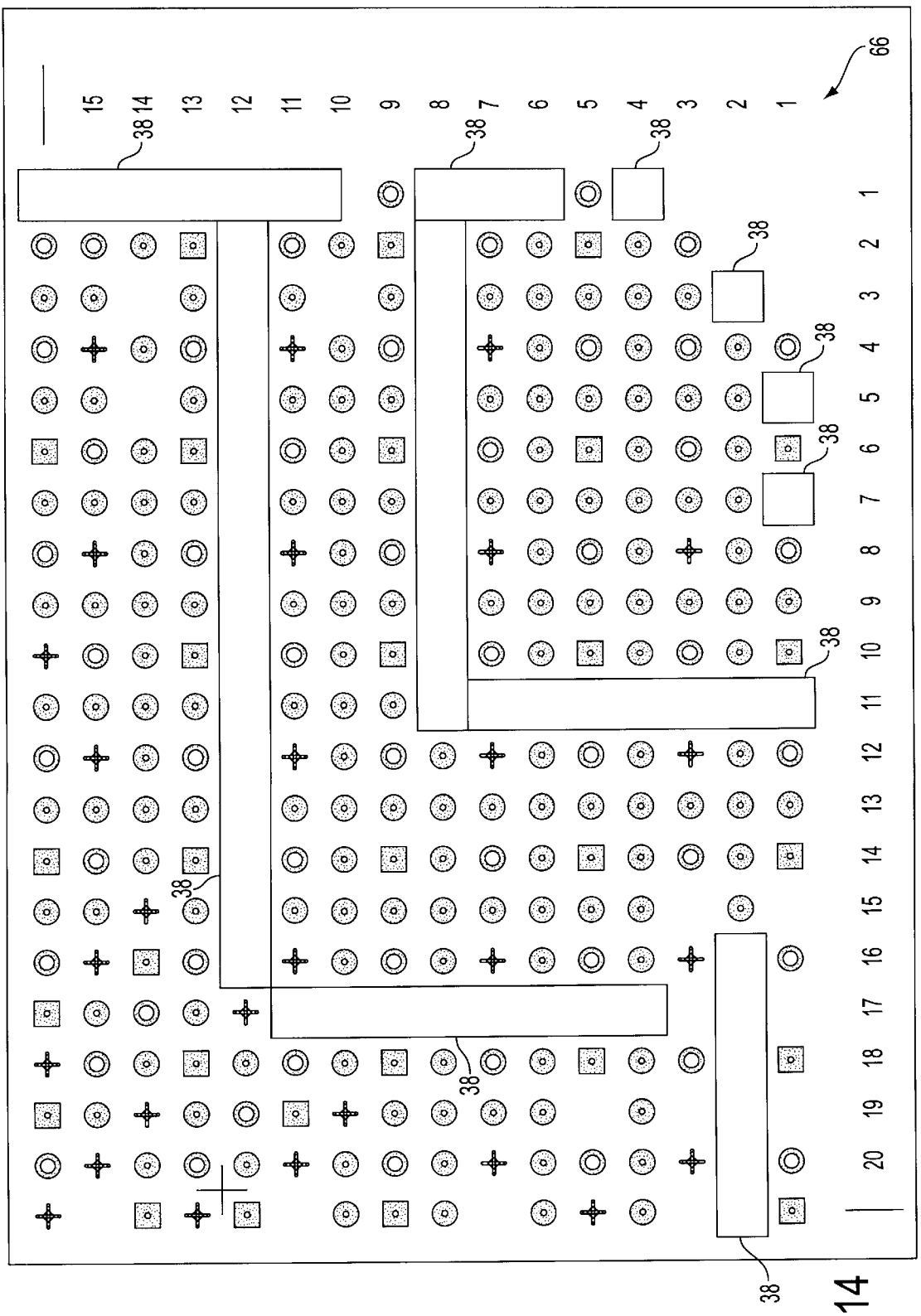
FIG. 14 shows a portion of a sixth power/ground plane layer of the multilayer printed circuit board shown in FIG. 1.

Referring to FIG. 14, there is shown a portion 66 of the power/ground plane layer 18f of the multilayer printed circuit board 10. As indicated above, this portion 66 of the power/ground plane layer 18f directly coincides with the quadrant 32 shown in FIG. 3. That is, this portion 66 of the power/ground plane layer 18f corresponds to the portion of the multilayer printed circuit board 10 where one quadrant of an electronic component having a surface mount grid array package with 1247 I/O contacts is mounted on the multilayer printed circuit board 10.

Similar to power/ground plane layers 18c and 18e, the power/ground plane layer 18f is primarily a ground plane layer except for vias formed therein. More particularly, the power/ground layer 18f includes a ground plane that is electrically connected to ground vias (i.e., GND in legend), but is not electrically connected to power vias (i.e., Vdd and Vdd2 in legend) or signal vias (i.e., signal in legend). Note that there are no test vias formed in the power/ground plane layer 18f as test contact pads and test signal runs are typically only formed on the primary layer 12. Also note that there are no vias formed in the power/ground plane layer 18f in the areas 38 of the multilayer printed circuit board 10, thereby forming channels in these areas 38 in this and other layers of the multilayer printed circuit board 10 in accordance with the present invention. These areas 38 of the multilayer printed circuit board 10 are devoid of vias in the power/ground plane layer 18f because microvias or via-in-pads are only formed in these areas 38 of the multilayer printed circuit board 10 extending from the primary layer 12 to the signal layer 16a, as described above.

Figure 15:
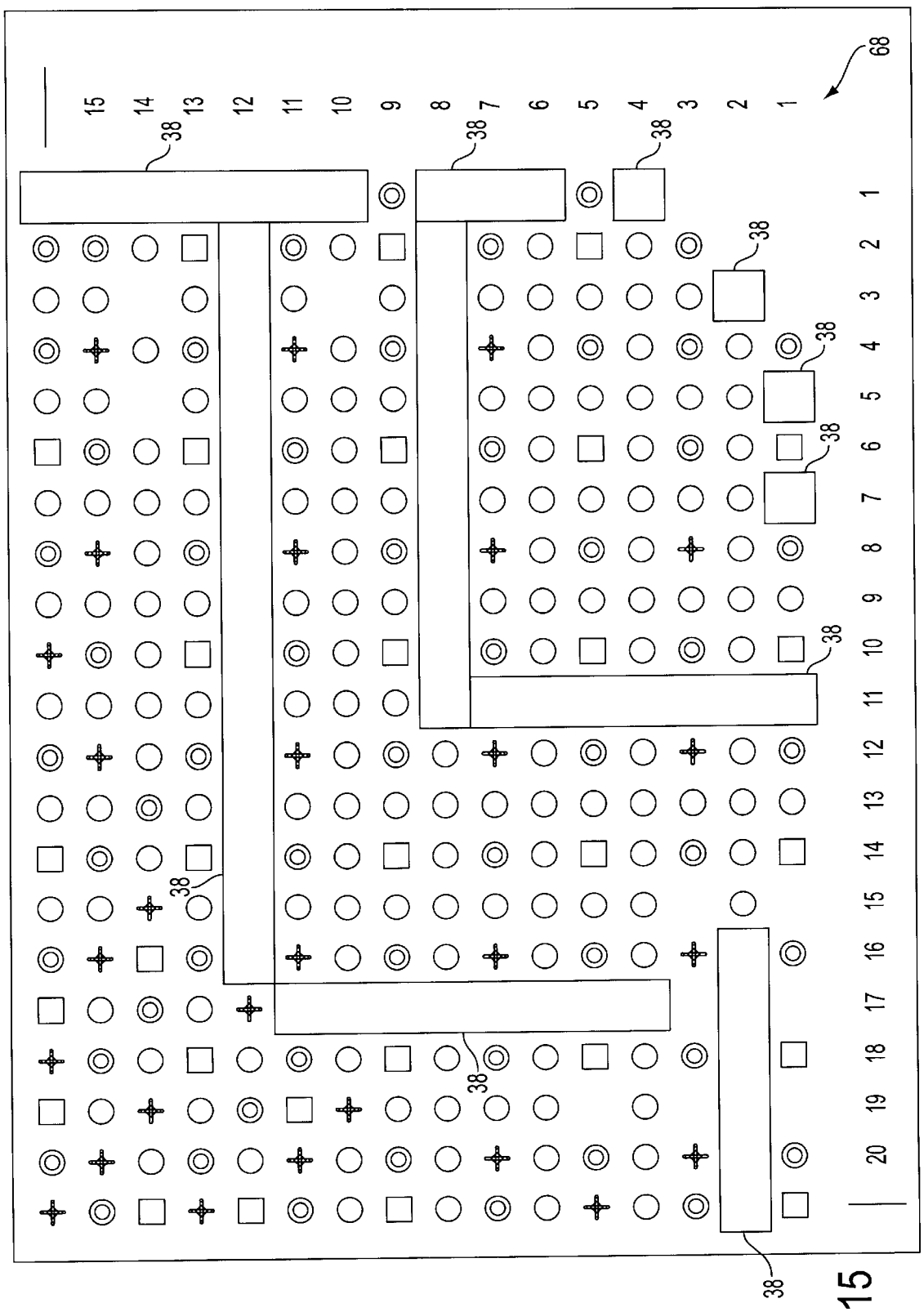
FIG. 15 shows a portion of the secondary layer of the multilayer printed circuit board shown in FIG. 1.

Referring to FIG. 15, there is shown a portion 68 of the secondary layer 14 of the multilayer printed circuit board 10. As indicated above, this portion 68 of the secondary layer 14 directly coincides with the quadrant 32 shown in FIG. 3. That is, this portion 68 of the secondary layer 14 corresponds to the portion of the multilayer printed circuit board 10 where one quadrant of an electronic component having a surface mount grid array package with 1247 I/O contacts is mounted on the multilayer printed circuit board 10.

As indicated above, the secondary layer 14 is primarily a power/ground plane layer except for contact pads formed thereon. More particularly, the secondary layer 14 includes a ground plane that is electrically connected to ground contact pads (i.e., GND in legend), but is not electrically connected to power contact pads (i.e., Vdd and Vdd2 in legend) or signal contact pads (i.e., signal in legend). Note that there are no test vias formed in the secondary layer 14 as test contact pads and test signal runs are typically only formed on the primary layer 12. Also note that there are no vias formed in the secondary layer 14 in the areas 38 of the multilayer printed circuit board 10, thereby forming channels in these areas 38 in this and other layers of the multilayer printed circuit board 10 in accordance with the present invention. These areas 38 of the multilayer printed circuit board 10 are devoid of vias in the secondary layer 14 because microvias or via-in-pads are only formed in these areas 38 of the multilayer printed circuit board 10 extending from the primary layer 12 to the signal layer 16a, as described above.

The present invention is not to be limited in scope by the specific embodiments described herein. Indeed, various modifications of the present invention, in addition to those described herein, will be apparent to those of ordinary skill in the art from the foregoing description and accompanying drawings. Thus, such modifications are intended to fall within the scope of the following appended claims. Further, although the present invention has been described herein in the context of a particular implementation in a particular environment for a particular purpose, those of ordinary skill in the art will recognize that its usefulness is not limited thereto and that the present invention can be beneficially implemented in any number of environments for any number of purposes. Accordingly, the claims set forth below should be construed in view of the full breath and spirit of the present invention as disclosed herein.

What is claimed is:

1. A method for reducing the number of layers in a multilayer circuit board, the multilayer circuit board having a plurality of electrically conductive signal layers for routing electrical signals to and from at least one electronic component mounted on a surface of the multilayer circuit board, the method comprising the steps of:

forming a first plurality of electrically conductive vias in the multilayer circuit board extending from the surface of the multilayer circuit board to a first of the plurality of electrically conductive signal layers, the first plurality of electrically conductive vias being arranged so as to form a channel in a second of the plurality of electrically conductive signal layers beneath the first plurality of electrically conductive vias;

routing a first plurality of electrical signals on the first of the plurality of electrically conductive signal layers; and routing a second plurality of electrical signals on the second of the plurality of electrically conductive signal layers in the channel formed in the second of the plurality of electrically conductive signal layers.

2. The method as defined in claim 1, wherein the first plurality of electrically conductive vias are arranged so as to form channels in other ones of the plurality of electrically conductive signal layers beneath the first plurality of electrically conductive vias, further comprising the step of:

routing subsequent pluralities of electrical signals on the other ones of the plurality of electrically conductive signal layers in the channels formed in the other ones of the plurality of electrically conductive signal layers until all electrical signals to and from the at least one electronic component have been routed.

3. The method as defined in claim 1, wherein the first plurality of electrically conductive vias electrically connect the at least one electronic component to the first of the plurality of electrically conductive signal layers.

4. The method as defined in claim 1, wherein the plurality of electrically conductive signal layers are separated by at least one dielectric layer.

5. The method as defined in claim 4, wherein at least some of the plurality of electrically conductive signal layers are also separated by at least one electrically conductive power/ground plane layer.

6. The method as defined in claim 5, wherein the surface of the multilayer circuit board is primarily an electrically conductive power/ground plane layer.

7. The method as defined in claim 1, further comprising the step of:

forming a second plurality of electrically conductive vias in the multilayer circuit board extending from the surface of the multilayer circuit board to other ones of the plurality of electrically conductive signal layers.

8. The method as defined in claim 7, wherein the second plurality of electrically conductive vias electrically connect the at least one electronic component to the other ones of the plurality of electrically conductive signal layers.

9. The method as defined in claim 8, wherein the first plurality of electrically conductive vias and the second plurality of electrically conductive vias form a contact array for the at least one electronic component, wherein at least one of the first plurality of electrically conductive vias is positioned along at least one edge of the contact array such that at least a portion of the channel is correspondingly formed along at least one edge of the contact array.

10. The method as defined in claim 1, further comprising the step of:

preselecting the first plurality of electrical signals to be routed on the first of the plurality of electrically conductive signal layers.

11. The method as defined in claim 10, wherein the preselected electrical signals are low speed electrical signals.

12. The method as defined in claim 10, wherein the preselected electrical signals are high speed electrical signals.

13. The method as defined in claim 1, wherein the at least one electronic component comprises an electronic component having a surface mount grid array package.

14. The method as defined in claim 1, wherein the width of the channel is based upon the arrangement of the first plurality of electrically conductive vias.

15. An improved multilayer circuit board, the multilayer circuit board having a plurality of electrically conductive signal layers for routing electrical signals to and from at least one electronic component mounted on a surface of the multilayer circuit board, the improvement comprising:

a first plurality of electrically conductive vias formed in the multilayer circuit board extending from the surface of the multilayer circuit board to a first of the plurality of electrically conductive signal layers, the first plurality of electrically conductive vias being arranged so as to form a channel in a second of the plurality of electrically conductive signal layers beneath the first plurality of electrically conductive vias;

a first plurality of electrical signals routed on the first of the plurality of electrically conductive signal layers; and a second plurality of electrical signals routed on the second of the plurality of electrically conductive signal layers in the channel formed in the second of the plurality of electrically conductive signal layers.

16. The improved multilayer circuit board as defined in claim 15, wherein the first plurality of electrically conductive vias are arranged so as to form channels in other ones of the plurality of electrically conductive signal layers beneath the first plurality of electrically conductive vias, the improvement further comprising:

subsequent pluralities of electrical signals routed on the other ones of the plurality of electrically conductive signal layers in the channels formed in the other ones of the plurality of electrically conductive signal layers until all electrical signals to and from the at least one electronic component have been routed.

17. The improved multilayer circuit board as defined in claim 15, wherein the first plurality of electrically conductive vias electrically connect the at least one electronic component to the first of the plurality of electrically conductive signal layers.

18. The improved multilayer circuit board as defined in claim 15, wherein the plurality of electrically conductive signal layers are separated by at least one dielectric layer.

19. The improved multilayer circuit board as defined in claim 18, wherein at least some of the plurality of electrically conductive signal layers are also separated by at least one electrically conductive power/ground plane layer.

20. The improved multilayer circuit board as defined in claim 19, wherein the surface of the multilayer circuit board is primarily an electrically conductive power/ground plane layer.

21. The improved multilayer circuit board as defined in claim 15, the improvement further comprising:

a second plurality of electrically conductive vias formed in the multilayer circuit board extending from the surface of the multilayer circuit board to other ones of the plurality of electrically conductive signal layers.

22. The improved multilayer circuit board as defined in claim 21, wherein the second plurality of electrically conductive vias electrically connect the at least one electronic component to the other ones of the plurality of electrically conductive signal layers.

23. The improved multilayer circuit board as defined in claim 22, wherein the first plurality of electrically conductive vias and the second plurality of electrically conductive vias form a contact array for the at least one electronic component, wherein at least one of the first plurality of electrically conductive vias is positioned along at least one edge of the contact array such that at least a portion of the channel is correspondingly formed along at least one edge of the contact array.

24. The improved multilayer circuit board as defined in claim 15, wherein the first plurality of electrical signals to be routed on the first of the plurality of electrically conductive signal layers are preselected.

25. The improved multilayer circuit board as defined in claim 24, wherein the preselected electrical signals are low speed electrical signals.

26. The improved multilayer circuit board as defined in claim 24, wherein the preselected electrical signals are high speed electrical signals.

27. The improved multilayer circuit board as defined in claim 15, wherein the at least one electronic component comprises an electronic component having a surface mount grid array package.

28. The improved multilayer circuit board as defined in claim 15, wherein the width of the channel is based upon the arrangement of the first plurality of electrically conductive vias.

* * * * *